United States Patent [19]
Ward

[11] Patent Number: 5,358,616

[45] Date of Patent: Oct. 25, 1994

[54] FILLING OF VIAS AND CONTACTS EMPLOYING AN ALUMINUM-GERMANIUM ALLOY

[76] Inventor: Michael G. Ward, 1 Haven Ct., #S-3B, Nyack, N.Y. 10960

[21] Appl. No.: 18,769

[22] Filed: Feb. 17, 1993

[51] Int. Cl.$^5$ ............................................. C23C 14/34
[52] U.S. Cl. .......................... 204/192.15; 204/129.12; 204/192.17; 437/189; 437/194
[58] Field of Search ...................... 204/129.12, 192.15, 204/192.17, 298.06, 298.11, 298.09; 437/192, 194, 197

[56] References Cited

U.S. PATENT DOCUMENTS

| | | | |
|---|---|---|---|
| 4,717,462 | 1/1988 | Homma et al. | 204/298 |
| 4,724,060 | 2/1988 | Sakata et al. | 204/298 |
| 4,824,544 | 4/1989 | Mikalesen et al. | 204/187 |
| 4,970,176 | 11/1990 | Tracy et al. | 437/187 |
| 4,994,162 | 2/1991 | Armstrong et al. | 204/192.15 |
| 5,108,570 | 4/1992 | Wang | 204/192.17 X |
| 5,171,412 | 12/1992 | Talieh et al. | 204/192.17 |

OTHER PUBLICATIONS

Sugano et al 1992 VMIC Conference Proceedings "Quarter Micron Hole Filling With SiN Sidewalls by Aluminum . . . ".

Kikuta et al 1991 VMIC Conference Proceedings "Al-Ge Reflow Sputtering For Submicron-Contact-Hole Filling".

*Primary Examiner*—Nam Nguyen

[57] ABSTRACT

A multi-step method of filling submicron vias with aluminum includes an initial deposition of about 1000 angstroms of aluminum which is sputter deposited at a temperature of about 150° C. Subsequently, a layer of an aluminum germanium alloy is deposited, again about 1000 angstroms at 150° C. or less. A third layer of aluminum without germanium is deposited at a temperature of about 150° C. Approximately 1000 angstroms is deposited. This is followed by a final aluminum deposition which is conducted at 450° to 500° C. to deposit 5000 to 15,000 angstroms of aluminum in total. The two depositions of aluminum, at the relatively low temperature of 150° C., prevents the germanium from precipitating and also permits the germanium to diffuse into these layers which increases the overall melting temperature of the deposited metal so that at subsequent higher treatment temperatures, the metal does not dewet the via surface.

7 Claims, No Drawings

FILLING OF VIAS AND CONTACTS EMPLOYING AN ALUMINUM-GERMANIUM ALLOY

BACKGROUND OF THE INVENTION

The active switching elements of integrated circuits are interconnected by metal lines deposited by various methods such as physical vapor deposition, chemical vapor deposition and evaporation. Typically, several levels of metal lines are used in an integrated circuit to allow crossovers. At certain locations, electrical contact is made between lines at different levels. Such locations are called vias. The drive of integrated circuits to submicron geometry results in vias and contacts of extreme aspect ratio and size. Filling submicron vias and contacts with a conducting metal is extremely difficult. However, if extreme care is not taken, voids will remain and the wafer will have to be discarded.

The use of aluminum as a material for filling interconnecting vias and contacts has been proposed. Surface diffusion is used to move sputter deposited aluminum into the via at temperatures of approximately 450° C. This is disclosed, for example, in Armstrong U.S. Pat. No. 4,994,162. This uses a low temperature seed layer providing a continuous high quality diffusion path for subsequently deposited material to diffuse along. A high temperature low deposition rate step to allow efficient surface diffusion into the feature is employed followed by a high temperature high deposition rate step to complete the deposition.

The sputter deposition of collimated aluminum is well known as disclosed, for example, in Mikalesen et al U.S. Pat. No. 4,824,544, Homma et al U.S. Pat. No. 4,717,462 and Sakata et al U.S. Pat. No. 4,724,060. The Homma and Sakata references specifically employ collimation of the sputtered aluminum to fill vias having a relatively high aspect ratio.

Bulk diffusion as a mechanism for via filling has also been proposed by Sugano et al in the 1992 VMIC Conference Proceedings "Quarter Micron Hole Filling With SiN Sidewalls By Aluminum High Temperature Sputtering." With the Sugano process, the driving force for via filling is the interface between a titanium surface layer and the deposited aluminum. This process requires the presence of a continuous and high quality titanium surface layer on the sidewall of a via.

Tracy U.S. Pat. No. 4,970,176 discloses deposition of a relatively thick layer of aluminum at a first temperature and a subsequent deposition of a thin layer of aluminum at a higher temperature. The specification indicates that the temperature increase acts to reflow the aluminum through grain growth and recrystallization. As shown from the specification, the filling of the via starts from the bottom of the via and works up to the top. At the time the Tracy application was filed, typically the vias were of a size greater than one micron.

Sputter depositing aluminum at low temperatures improves step coverage reliability but at a drastic loss of overall step coverage. This is a result of insignificant aluminum mobility at temperatures less than 300° C. The use of aluminum alloys with lower melting points can be used to lower the temperature necessary for significant mobility. However, there are several problems with using such alloys. Due to the low melting temperature of these alloys, they cannot withstand temperatures of subsequent processing steps. Germanium in aluminum-germanium alloys also tends to precipitate increasing resistance.

Summary of the Invention

The present invention is premised on the realization that vias and contacts can be effectively and reliably filled by sputter deposition of aluminum.

More particularly, the present invention utilizes a multi-stepped deposition incorporating an initial deposition of a thin layer of aluminum at a low temperature. This is followed by a subsequent deposition of a thin layer of an aluminum-germanium alloy followed by a subsequent deposition of a second layer of aluminum at a low temperature. This is then followed up by a final deposition of aluminum at a relatively high temperature which will allow surface diffusion of the deposited aluminum.

By using this multi-layer deposition process, dewetting of the via or contact surface is avoided, yet surface diffusion of the deposited layer will occur providing a filled via or contact.

The objects and advantages of the present invention will be further appreciated in light of the following detailed description.

Detailed Description

The present invention is a method of filling vias and contacts, particularly those having submicron diameters where the aspect ratio of the via, that is the height-/diameter ratio, is from about 1 to about 4. In practicing the present invention, vias and contacts having diameters from 1 to about 0.1 microns, and generally 1 to about 0.3 microns, can be filled. For the purposes of the present invention, vias and contacts will collectively be referred to as simply as vias.

The present invention is a four-step process. In the first step, a thin layer of aluminum is sputter deposited at a low temperature. In a second step, an aluminum-germanium alloy layer is sputter deposited again at a low temperature. A third layer of aluminum is then deposited again at a low temperature. This is followed up by the deposition of a thick layer of aluminum at a higher temperature. The final temperature is maintained at about 500° C. to allow surface diffusion of the deposited aluminum layer and planarization thereof.

The substrates which include the vias which will be coated in the present invention include silicon substrates, boron trifluoride, doped silica substrates, quartz substrates, and gallium arsenide substrates. The aluminum layer can be formed from 100% aluminum and aluminum alloys such as aluminum-silicon (1%)-copper (0.5%), aluminum-copper (1%), and aluminum-titanium (0.15%).

The initial deposition of a thin layer of aluminum will be conducted at less than 150° C. and less than or equal to about 1000 angstroms will be applied.

In the second step, an aluminum-germanium alloy is deposited. The aluminum-germanium alloy is meant to include AlGe, AlSiGe, AlCuSiGe with the germanium content of 1–5 weight percent. This aluminum-germanium alloy is deposited again at a relatively low temperature less than or equal to 150° C. Only about 1000 angstroms of the aluminum-germanium alloy is deposited.

In the third step, again less than or equal to about 1000 angstroms of aluminum or the aluminum alloy (without germanium) is deposited at a low rate of about 150° C. After depositing about 1000 angstroms of material, the temperature are increased to about 500° C. and from about 5000 to 15,000 angstroms of aluminum are deposited.

In the first three depositions of the aluminum layer, the aluminum germanium layer and the subsequent aluminum layer, all of these depositions can be conducted with or without the assistance of a collimator. With the aluminum-germanium layer sandwiched between the aluminum layers, precipitation of germanium may be reduced or eliminated. Further, in the subsequent processing, the germanium will migrate into these aluminum layers which will increase its melting temperature and decrease the likelihood of dewetting as the continued deposition of aluminum continues.

Preferably, the multi-step deposition of the present invention is conducted in a multi-chambered sputtering unit which would include an etching chamber and at least three sputtering chambers. One such machine is an eclipse brand sputtering system sold by Materials Research Corporation also referred to in U.S. Pat. No. 4,994,162. Other commercially available systems are equally suited.

In the first chamber, the substrate or the wafer is initially etched with argon gas to remove surface impurities. Heating of the substrate also assist in removal of outgases. This is optional, but preferred. The substrate is then transferred to a second chamber where a barrier layer can be applied if desired. A preferred barrier layer is titanium nitride although zirconium nitride, ruthenium oxide barrier layers as well as titanium tungsten. Generally the thickness of the barrier layer will be about 1000 angstroms.

Next, the wafer is transferred to a third chamber which may or may not include a collimator if desired. If a collimator is used, one having an aspect ratio of 1 to 2 would be preferred. Again, the collimator is preferred although not required. In this step, aluminum or an aluminum alloy which does not contain germanium is sputter deposited at a temperature less than 150° C. The applied power onto the target would be from about 10 to 15 kilowatts and this would continue until about 1000 angstroms of aluminum is deposited. The wafer would then be transferred to a third chamber where the aluminum-germanium alloy would be deposited. The deposition, again, would be conducted at less than 150° C. with an applied power onto the target of 10 to 15 kilowatts. This can also be conducted using the collimator if desired.

After 1000 angstroms of the aluminum-germanium alloy is deposited, the wafer is transferred to a fourth chamber (or returned to the first alloy chamber) in which an aluminum or a nongermanium containing aluminum alloy is deposited. Generally, the initial temperature of the wafer in the third chamber will be about 150° C. Again, with an applied power of 10–15 kilowatts, about 1000 angstroms of the aluminum is deposited. Upon completion of this initial deposition, the temperature of the wafer will be increased to about 400° to 500° C. as the final aluminum deposition occurs. The temperature is increased by application by back plane gas. Generally in this final deposition, the applied power will be again 5 to 15 kilowatts. A bias voltage of 300 to 400 volts can be applied if desired, but is not necessary. Once the deposition is completed, the temperature may be maintained at 450° to 500° C. for 1 to 2 minutes to provide for bulk diffusion of the aluminum layer for planarization. The wafer is allowed to cool and the via is effectively filled. The wafer can then be processed further as desired.

According to this method, a very precise triple layer of aluminum alloy, aluminum-germanium, and aluminum alloy is deposited which does not dewet from the surface of the via when subsequently germanium alloy allows the germanium to be distributed by diffusion throughout the three layers, thus, reducing detrimental nodule precipitation and high resistivity. The redistribution also elevates the material melting point closer to that found in traditional aluminum alloys in the semiconductor industry.

Further, by employing the aluminum-germanium alloy, the via can be initially filled at relatively low temperatures.

Since the germanium migrates through the aluminum layers dewetting of the aluminum-germanium alloy is avoided. Subsequent heat treatment will cause bulk diffusion or surface diffusion of the aluminum causing adequate planarization of the aluminum layer. Thus, the present invention provides a rapid, economical, effective method of filling micron and submicron vias and contacts with aluminum.

This has been a description of the present invention along the best mode currently known to the inventor of practicing the invention.

However, the invention itself should only be defined by the appended claims wherein I claim:

1. A method of filling vias in a semiconductor substrate comprising:
   sputter depositing a first layer of nongermanium containing aluminum onto a substrate containing said vias at a temperature less than 150° C.;
   sputter depositing a layer of aluminum-germanium alloy at a temperature less than 150° C.;
   coating said layer of aluminum-germanium alloy with a second layer of a nongermanium containing aluminum alloy by sputter depositing said second layer of nongermanium containing aluminum at less than or equal to 150° C.;
   depositing a third layer of nongermanium containing aluminum onto said substrate at a temperature of 400° to 500° C. wherein the total thickness of all said layers is from about 5000 to about 15,000 angstroms.

2. The method claimed in claim I wherein said aluminum-germanium alloy comprises 1 to about 5% of germanium.

3. The method claimed in claim 2 wherein said first deposition of non-germainium containing aluminum is conducted through a collimator.

4. The method claimed in claim 3 wherein said deposition of aluminum-germanium alloy is conducted through a collimator.

5. The method claimed in claim 1 wherein said aluminum-germanium alloy is deposited at a temperature less than 150° C. with an applied power of 10–15 kilowatts.

6. The method claimed in claim 1 wherein said first layer is about 1000 angstroms thick.

7. The method claimed in claim 1 wherein said substrate is maintained at a temperature of 450° C. to 500° C. after said third layer is deposited for a period of 1 to 2 minutes.

* * * * *